United States Patent
Mihlin

(10) Patent No.: US 11,906,653 B2
(45) Date of Patent: Feb. 20, 2024

(54) SYSTEM AND METHOD OF CALIBRATING A RADAR ROTATABLE ANTENNA SYSTEM

(71) Applicant: ELTA SYSTEMS LTD., Ashdod (IL)

(72) Inventor: Michael Mihlin, Ashdod (IL)

(73) Assignee: ELTA SYSTEMS LTD., Ashdod (IL)

( * ) Notice: Subject to any disclaimer, the term of this patent is extended or adjusted under 35 U.S.C. 154(b) by 466 days.

(21) Appl. No.: 17/292,607

(22) PCT Filed: Nov. 18, 2019

(86) PCT No.: PCT/IL2019/051259
§ 371 (c)(1),
(2) Date: May 10, 2021

(87) PCT Pub. No.: WO2020/105041
PCT Pub. Date: May 28, 2020

(65) Prior Publication Data
US 2022/0365174 A1    Nov. 17, 2022

(30) Foreign Application Priority Data
Nov. 19, 2018    (IL) .......................................... 263136

(51) Int. Cl.
*G01S 7/40*    (2006.01)
*H01Q 3/08*    (2006.01)
*H01Q 3/26*    (2006.01)

(52) U.S. Cl.
CPC .............. *G01S 7/4004* (2013.01); *H01Q 3/08* (2013.01); *H01Q 3/267* (2013.01)

(58) Field of Classification Search
CPC ....... G01R 29/10; G01S 13/74; G01S 13/865; G01S 7/4004; G01S 7/4026; G01S 7/403; G01S 7/4034; G01S 7/4052; G01S 7/4086; G01S 7/4095; H04B 17/12; H01Q 1/1257; H01Q 3/08; H01Q 3/267
See application file for complete search history.

(56) References Cited

U.S. PATENT DOCUMENTS

2004/0209574 A1*  10/2004  Tsay ..................... H01Q 1/1257
                                                     455/67.14

FOREIGN PATENT DOCUMENTS

| CN | 101101332 A | 1/2008 |
|----|-------------|--------|
| CN | 102854497 A | 1/2013 |
| CN | 105607650 A | 5/2016 |

* cited by examiner

*Primary Examiner* — Timothy A Brainard
(74) *Attorney, Agent, or Firm* — Dorsey & Whitney LLP

(57) ABSTRACT

A calibration utilizes reference data indicative of a position of a target element relative to a reference location, of a position of a reference point on a rotatable support relative to the reference location, orientation data indicative of at least one angular position of the rotatable support, and antenna measurement data indicative of electromagnetic echo signals received by a radar antenna from the target element. A measured position of the target element relative to the radar antenna is determined based on at least a portion of the antenna measurement data. A reference position of the target element relative to the radar antenna is determined based on the reference data and on at least a portion of the orientation data. At least one bias value or function associated with the orientation data and/or the antenna measurement data is determined based on a deviation between the determined measured position and reference position.

20 Claims, 5 Drawing Sheets

OD – orientation data

MD – measurement data

BD – biases data

RD – reference data

SYSTEM AND METHOD OF CALIBRATING A RADAR ROTATABLE ANTENNA SYSTEM

TECHNOLOGICAL FIELD

The present invention is generally in the field of radar antenna calibration, and particularly relates to calibration of a radar rotatable antenna that is not externally viewable.

BACKGROUND

Accurate measurement of target position relative to a stationary point that can be used for measuring phase center of the antennas is essential in radar systems. Usually this measurement involves two measurement systems of the radar antenna:
(i) an antenna orientation measurement system configured for measuring orientation in space of the radar antenna; and
(ii) target location measurement system configured for measuring coordinates of a target relative to the location of the radar antenna.

The antenna orientation measurement system typically utilizes multiple sensor devices to measure orientations of the radar antenna with respect to the direction of the North and the horizontal plane (i.e., the plane perpendicular to the gravity vector) to ensure that the antenna is properly positioned for transmission and reception of electromagnetic signals in/from a determined direction, and/or for adjusting the transmitted/received signals to comply with certain directionality requirements (e.g., beam steering).

The target location measurement system typically utilize devices of the radar system to measure direction of arrival of electromagnetic echo signals relative to the radar antenna, and/or distance between the radar antenna and the target from which the electromagnetic echo signals are arriving (range).

However, the sensors used in the antenna orientation measurement system, and the devices used in the target location measurement system, typically have non-linear operational regions, varying accuracy ranges, and/or sensitivity to environmental conditions (e.g., temperature, pressure, etc.). Moreover, the mechanical structure of the radar system is changing over time due to various different mechanical and environmental conditions. Hence, the target location measurement system and the antenna orientation measurement system need to be routinely calibrated (e.g., bias values/functions introduced in the outputs of the antenna orientation measurement system and of the target location measurement system needs to be filtered out) in order to guarantee continuous reliable operation of the radar system. Since the radar antenna is usually enclosed in a protective enclosure (e.g., Radome) to prevent environmental wear/damages and/or to conceal the antenna, external inspection of the antenna orientation is typically not possible, or difficult to achieve (i.e., requires removal of the protective Radome).

For example, radar systems calibration is usually carried out by measuring radar signals received from a known reference target (RFT), using either calibration flight (CF), or calibration tower (CT) techniques.

In the calibration flight approach the antenna of the radar system is situated in a fixed position, and operated to track a moving target e.g., calibration air vehicle. The calibration in this technique requires knowledge of the accurate trajectory of the moving target, which is used for calculation of bias values based on the differences between the trajectory measured by the radar system and the known trajectory of the moving target. However, the calibration flight approach is impossible to implement in certain applications/scenarios since a suitable moving target can be available for antenna calibration only for certain setups. In addition, accurate positions of the antenna of the radar system and/or of the moving target may be difficult/impossible to obtain e.g., if there is no, or limited, reception of GPS satellites, and the range accuracy in this technique is restricted due to glint errors/noise.

The calibration tower approach utilizes a RF transponder (RFT) coupled to a stationary target antenna situated in a fixed known geographic position in the far field of the radar antenna, for measuring the position of the RFT antenna. The bias values are calculated in this approach based on the difference between the position of the target antenna position, as measured by the radar system, and the known position of the stationary RFT Antenna. However, as in the calibration flight approach, the accurate positions of the antennas of the radar system and/or of the RFT system are not always available e.g., if there is no, or limited, reception of GPS satellites.

Chinese patent publication No. 101101332 describes a CCD laser theodolite dynamic radar calibration method. A measuring system utilizing laser distance measurer, theodolite, CCD camera, and GPS timing components, to complete ship-carried coordinate dynamic calibration, and in the calibration course, to apply conversion between UTM coordinates and WGS-84 coordinates for ship-carried radar dynamic calibration. High accuracy measurement are reported, where 10 s angular accuracy, and 0.5 m position accuracy, been obtained. The described method can save lots of man power and material resources, as it uses CCD camera to record radar feed state in real-time and for afterwards processing, and since the instrument-carried, and shore-based radar calibrators, are united.

Chinese patent publication No. 102854497 describes a method for zero calibration of a radar antenna. Under the conditions of not disassembling a radar unit at an outer field, regular checking and calibration is conducted by creatively adopting a method for comparing optical measurement with radar angle electrical parameter measurement, fault isolation can be conducted after angle tracking parameters in an onboard radar guiding system on site, and whether the zero offset of the radar antenna causes the fault can be determined. In addition, the method can be used for regularly checking the radar antenna, and measurement and zero calibration of mechanical parameter and the electrical parameter of the radar antenna. According to the design, the calibration method solves the difficulty of incapability of calibrating the any positioning angle of the radar antenna.

GENERAL DESCRIPTION

Operational field antennas are typically enclosed inside a protective optically opaque structures. The antenna calibration techniques described hereinabove are not suitable for accurate calibration of antennas that are not externally viewable. There is thus a need in the art for antenna calibration techniques allowing to determine accurate calibration bias values for antenna systems over the entire range of possible antenna orientations, while the antenna system being in operational field conditions, and to permit robust calibration of the antenna immediately thereafter during its operation i.e., without removing the antenna protective enclosure and without using location determining equipment, such as global-positioning-systems (GPS).

The radar systems calibration techniques disclosed herein utilize an arbitrarily positioned stationary target element (also referred to herein as referent target element—RFT), at least one sensor for generating orientation data/signals indicative of orientation of a rotatable pedestal (also referred to herein as rotatable support) carrying the radar antenna that is being calibrated, radar system devices configured to measure direction of arrival of electromagnetic echo signal relative to the radar antenna and/or distance between the radar antenna and the target (range) and generate respective directional data, arbitrarily positioned stationary surveying device for generating reference location data/signals associated with the target and with the rotatable pedestal, and a control unit for processing the orientation data/signals, the directional data, and the reference location data, and determine based thereon calibration data for the radar system.

The target element (see, e.g., reference numeral 1 in FIG. 6) in some embodiments is implemented by an RF antenna (1) and a transponder (18) coupled to it. The transponder (18) comprises in some embodiment a circulator (2) configured to provide separation between input radar signals (7i) and output radar signals (7u i.e., the echo signals returned to the radar antenna) of the transponder, and a delay line (3) configured to increase the delay between the input and output radar signals. The target RF antenna (1) can be mounted on an adjustable column/post (e.g., tripod) arbitrarily positioned (i.e., geographical coordinates/location of the target antenna are not known) in the far-field region of the radar antenna (12) that is being calibrated (the region in which the radiation pattern transmitted by the antenna does not change its shape with respect to distance from the antenna).

The surveying device can be implemented by a range finder (e.g., a type of distance sensor, such as, but not limited to laser distance sensor—LDM) and angle finder (e.g., theodolite, electronic compass) units arbitrarily positioned in a line-of-sight to the rotatable pedestal carrying the radar antenna (12) that is being calibrated (i.e., geographical coordinates/location of the of the range finder and angle finder units are not known) and cooperatively arranged to measure a position (polar coordinates e.g., azimuth, elevation, and range) of the target antenna (1) and of a reference point on the rotatable pedestal. Optionally, but in some embodiments preferably, the surveying device is used to measure polar coordinates of a center of the rotatable pedestal, and of the target antenna, relative to the location of the surveying device.

In some embodiments the surveying device is implemented by a type of total station surveyor comprising an electronic theodolite cooperatively arranged with an electronic distance measurement (EDM) meter, such as, but not limited to a gyro theodolite (GT). The gyro theodolite typically comprises a gyroscopic compass mounted to a theodolite for measuring azimuth, tilt sensors for measuring elevation angles of a target relative to the position of the gyro theodolite, and an EDM meter for measuring the distance between the gyro theodolite and the target. The gyro theodolite is used to determine azimuth of a viewed object (the angle between the true North and a projection of the direction to the viewed object onto the horizontal plane of the gyro theodolite) and elevation to the viewed object (the angle between the direction to the viewed object and a projection of the direction to the viewed object onto the horizontal plane of the gyro theodolite), and the EDM (e.g., laser range finder) is used to measure the distance between the gyro theodolite and the viewed object.

This setup can be thus used to determine geographic polar coordinates of the reference target element (1) and the center of the rotatable pedestal, which can be transformed into Cartesian coordinates, or any other suitable coordinate system, relative to the location of the gyro theodolite. The measurement accuracy of the gyro theodolite in azimuth and elevation is usually better than 0.1 milliradian, and the range accuracy of the EDM meter is usually better than 1 cm. The features of this GT/EDM setup are thus favorable for the calibration of radar antenna systems.

One inventive aspect of the subject matter disclosed herein relates to a method of calibrating a radar antenna mounted on a rotatable support, where the radar antenna is mounted at a predetermined position relative to a reference point on the rotatable support. The method comprising receiving reference data indicative of a position of a target element relative to a reference location, and of a position of the reference point on the rotatable support relative to the reference location, receiving orientation data indicative of at least one angular position of the rotatable support and, antenna measurement data indicative of electromagnetic echo signals received by the radar antenna from the reference target element, determining a measured position of the target element relative to the radar antenna, based on at least a portion of the antenna measurement data, determining a reference position of the target element relative to the radar antenna based on the reference data and on at least a portion of the orientation data, and determining at least one bias value or function associated with at least one of the orientation data and the antenna measurement data, based on a deviation between the determined measured position of the target element and the reference position of the target element.

The method comprises in some embodiments rotating the rotatable support into two or more different angular positions, determining two or more respective orientation data instances for each of the different angular positions of the rotatable support, determining corresponding two or more measured position instances of the target element based on respective electromagnetic echo signals received by the radar antenna at the two or more angular positions, determining corresponding reference position instances of the target element based on the respective two or more orientation data instances and the reference data, and determining at least one bias value or function for each of the two or more different angular positions of the rotatable support based on a deviation between the measured position and the determined reference position of the target element determined for each of the two or more different angular positions of the rotatable support.

Optionally, but in some embodiments preferably, a curve fitting process is used to determine the at least one bias value or function based on the deviation between the respective determined measured and reference positions instances of the target element. For example, and without being limiting, the curve fitting process can comprise a least mean squares error minimization process.

The at least one angular position of the rotatable support comprises in some embodiments at least one of the following: a measured azimuth angle of the rotatable support, a measured roll tilt angle of the rotatable support, and a measured pitch tilt angle of the rotatable support. The determining the reference position of the target element can comprise processing data indicative of the at least one angular position of the rotatable support. The determining of the measured position of the target element comprises in some embodiments processing data indicative of the electromagnetic echo signal received from target element.

In some possible embodiments the reference position and the measured position of the target element are determined relative to a center of the radar antenna. The determining of the reference position of the target element can thus comprise determining a position of the center of the radar antenna relative to the reference point of the rotatable support.

The radar antenna can be a type of phased array antenna. In this case the reference and measured positions of the target element are determined relative to a phase center of the phased array antenna. The determining of the reference position of the target element can thus comprise determining a position of the phase center of the radar antenna relative to the reference point of the rotatable support.

Optionally, but in some embodiments preferably, the reference point on the rotatable support is a center of the rotatable support. The orientation data can comprise a measured elevation angle of the radar antenna. The determining of the reference position of the target element can comprise determining a position of the center of the radar antenna relative to the reference point of the rotatable support based on the measured elevation angle. The method comprises in some embodiments generating the reference data by a surveying system configured to measure polar coordinates of the target element, and of the reference point, relative to the reference location.

The at least one bias value comprises in some embodiments at least one of the following: bias of a measured azimuth angle of the rotatable support, bias of a measured elevation angle of the antenna, bias of a measured roll tilt angle of the rotatable support, and bias of a measured pitch tilt angle of the rotatable support. Optionally the measured pitch tilt angle of the rotatable support is derived from the bias of a measured elevation angle of the antenna.

Another inventive aspect of the subject disclosed herein relates to a system for calibrating a radar system comprising a radar antenna mounted on a rotatable support at a predetermined position relative to a reference point on the rotatable support. The system comprises an orientation measurement system configured to measure at least one orientation angle of the rotatable support and generate orientation data indicative of at least one angular position of the rotatable support, a surveying device configured to measure position of a target element, and a position of the reference point on the rotatable support, and generate reference data indicative thereof, and a control unit comprising one or more processors and memories configured and operable to receive antenna measurement data indicative of electromagnetic echo signals received by the radar antenna from the reference target element, determine a measured position of the target element relative to the antenna based on at least a portion of the antenna measurement data, determine a reference position of the target element relative to the radar antenna based on the reference data and on at least a portion of the orientation data, and determine at least one bias value or bias function associated with at least one of the orientation data and the antenna measurement data, based on a deviation between the determined measured position and reference position of the target element.

The control unit is configured and operable in some embodiments to generate instructions for rotating the rotatable support into two or more different angular positions, receive from the orientation measurement system two or more respective orientation data instances for each of the different angular positions of the rotatable support, determine corresponding two or more respective measured position instances of the target element based on respective electromagnetic echo signals received by the radar antenna at the two or more different angular positions, determine corresponding reference position instances of the target element based on the respective two or more orientation data instances and the reference data; and determine at least one bias value or function for each of the two or more different angular positions of the rotatable support based on a deviation between the respective determined measured position of the target element and reference position of the target element at each of the two or more different angular positions.

The control unit can be configured and operable to apply a curve fitting process based on the deviation between the respective determined measured and reference positions instances of the target element, and deriving the at least one bias value or function therefrom. Optionally, but in some embodiments preferably, the at least one angular position of the rotatable support measured by the orientation measurement system comprises at least one of the following: a measured azimuth angle of the rotatable support, a measured roll tilt angle of the rotatable support, and a measured pitch tilt angle of the rotatable support.

The control unit is configured and operable in some embodiments to determine the reference position and the measured position of the target element relative to a center of the radar antenna. This way, the reference position of the target element can be determined by the control unit based on a position of the center of the radar antenna relative to the reference point of the rotatable support. The radar antenna can be a type of phased array antenna. The control unit can be thus configured and operable to determine the reference and measured positions of the target element relative to a phase center of the phased array antenna, and to determine the reference position of the target element based on a position of the phase center of the radar antenna relative to the reference point of the rotatable support. The reference point in some embodiments is a center of the rotatable support. The control unit can be configured and operable to accordingly to determine the reference position of the target element based on a position of the center of the radar antenna relative to the reference point of the rotatable support.

The orientation data comprises in some embodiments a measured elevation angle of the radar antenna. The control unit can be configured and operable to determine the position of the center of the radar antenna relative to the reference point of the rotatable support based on the measured elevation angle. The surveying device comprises in some embodiments a range finder capable of measuring a distance between the surveying device and the target element. The surveying device can also comprise an angle finder capable of measuring angular position of the target element with respect to the surveying device.

In some embodiments the surveying device comprises a gyro theodolite. Optionally, but in some embodiments preferably, the target element comprises at least one antennas element coupled to a transponder configured to cause a time delay (e.g., of up to 1 millisecond, for separation of the ground reflection lobes of the echo signals from the originating radar signal) in the receipt of the electromagnetic signals from the target element by the radar antenna. The control unit can be configured and operable to determine a bias value or function for at least one of the following: a measured azimuth angle of the rotatable support, a measured elevation angle of the antenna, a measured roll tilt angle of the rotatable support, and a measured pitch tilt angle of the rotatable support.

BRIEF DESCRIPTION OF THE DRAWINGS

In order to understand the invention and to see how it may be carried out in practice, embodiments will now be described, by way of non-limiting example only, with reference to the accompanying drawings. Features shown in the drawings are meant to be illustrative of only some embodiments of the invention, unless otherwise implicitly indicated. In the drawings like reference numerals are used to indicate corresponding parts, and in which.

DETAILED DESCRIPTION OF EMBODIMENTS

Figure 1:
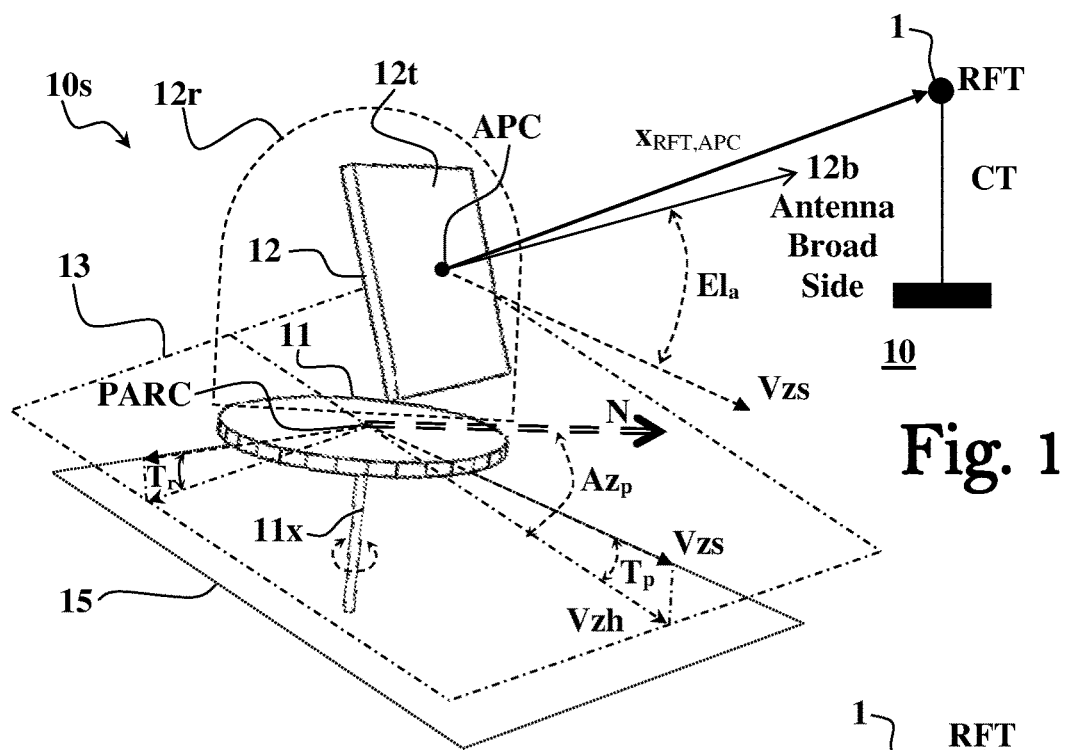
FIG. 1 schematically illustrates an arrangement of a radar antenna and RFT antenna, mechanical installation structure and orientation parameters thereof, that can be calibrated in some possible embodiments.

One or more specific embodiments of the present disclosure will be described below with reference to the drawings, which are to be considered in all aspects as illustrative only and not restrictive in any manner. In an effort to provide a concise description of these embodiments, not all features of an actual implementation are described in the specification. Elements illustrated in the drawings are not necessarily to scale, or in correct proportional relationships, which are not critical. Emphasis instead being placed upon clearly illustrating the principles of the invention such that persons skilled in the art will be able to make and use the calibration setups disclosed herein, once they understand the principles of the disclosed techniques. This disclosure may be provided in other specific forms and embodiments without departing from the essential characteristics described herein.

The antenna calibration techniques used heretofore required global positioning systems and/or direct sight of the antenna, and thus cannot be used to determine bias values for antenna systems concealed inside a protective optically opaque structure without global positioning data. The present disclosure provides techniques for calibration of an antenna mounted on a predetermined position on a rotatable support (also referred to herein as rotatable pedestal) using optical (land) surveying equipment (e.g., gyro theodolite equipped with EDM), without having direct sight of the antenna itself (i.e., the antenna is enclosed inside an optically opaque structure). The calibration process aims to determine bias values of various parameters measured by the antenna systems based on at least the following data:
    known position of the antenna relative to the center of the rotatable support;
    position of a reference target element measured by the surveying equipment relative to a reference location, in which the surveying equipment is positioned;
    position of a center of the rotatable support measured by the surveying equipment relative to a reference location, in which the surveying equipment is positioned;
    orientation parameters of the rotatable support/antenna being calibrated measured by one or more sensor devices of the antenna orientation system;
    radar antenna coordinates (e.g., polar, sine space coordinates) of the reference target element relative to the antenna being calibrated, measured by target location measurement system of the radar system using electromagnetic echo signals received by the radar antenna being calibrated from the reference target element.

It is noted that though during the calibration process the antenna being calibrated is maintained in a fixed known position on the rotatable support, in some embodiments the position/orientation of the antenna being calibrated on the rotatable support can be adjusted.

In some embodiments the determined bias values include at least one of orientation parameters bias value: azimuth bias value ($B_{Az}$) for calibrating measured orientation azimuth angle of the rotatable support ($Az_{pm}$), elevation bias value ($B_{El}$) for calibrating measured orientation elevation angle of the antenna ($El_{am}$), roll bias value ($B_{Tr}$) for calibrating measured orientation roll angle of the rotatable support ($T_{rm}$), and at least one of the coordinates of the reference target element (also referred to herein as radar antenna measurement coordinates) relative to radar antenna being calibrated, as measured by the target location measurement system of the radar system based on the electromagnetic echo signals received by the radar antenna being calibrated from the reference target element.

The bias value of the coordinates of the reference target element measured by the radar antenna being calibrated comprises in some embodiments at least one of: antenna measurement azimuth bias ($B_u$) for calibrating reference target measured azimuth ($u_m$), antenna measurement elevation bias ($B_v$) for calibrating reference target measured elevation angle ($v_m$), and antenna measurement range/distance bias ($B_r$) value for calibrating reference target measured range/distance ($r_m$).

Optionally, a pitch bias value ($B_{Tp}$) for calibrating a measured pitch angle of the rotatable support ($T_{pm}$) is also determined. In some embodiments the pitch bias value ($B_{Tp}$) is a part of the elevation bias value ($B_{El}$), and in such cases there is no need to define it separately. If the radar antenna system is positioned such that the plane of the rotatable support is parallel to its horizontal plane, then a calibration process of the orientation parameters may be limited only to determining the azimuth bias value ($B_{Az}$), the elevation bias value ($B_{El}$), and/or the antenna measurement coordinates bias values ($B_u$, $B_v$, $B_r$).

The calibration process utilizes in some embodiments radar antenna measured coordinates of the reference target ($S_{RFT,APC}$, m), and radar antenna reference coordinates of the reference target ($S_{RFT,APC}$,r), both being in the radar antenna measurement coordinate system. The radar antenna measured coordinates of the reference target (i.e., using a coordinate system centered at a center of the antenna e.g., sine space) are radar antenna coordinates of the reference target (RFT) obtained from measurement of the electromagnetic echo signals, which are received by the radar antenna being calibrated from the reference target element (RFT) for a specific position/orientation of the radar antenna. The radar antenna reference coordinates are radar antenna coordinates of the reference target element (RFT) obtained by calculations, using the following reference data:
- optically measured position of the reference target element;
- optically measured position of the center of the rotatable support, relative to a reference location of the surveying equipment;
- angular position parameters of the radar antenna (also referred to herein as orientation data), as measured by the antenna orientation measurement system.

The angular position parameters of the radar antenna that is being calibrated comprises in some embodiments a measured azimuth angle of the rotatable support ($Az_{pm}$), and possibly also a measured elevation angle ($El_{am}$) of the radar antenna being calibrated, and/or a measured roll tilt angle of the rotatable support, and/or measured pitch tilt angle of the rotatable support.

It is noted that the radar antenna measured coordinates of the reference target, and the computed reference coordinates can be determined for a plurality of different antenna angular position parameters.

In some embodiments the radar antenna measured coordinates of the reference target, and the reference radar antenna measured coordinates of the reference target, are used for an optimization process configured to generate the bias values for calibration of the radar antenna. The biases calculation process comprises in some embodiments a fitting procedure, which minimizes the difference between the radar antenna measured coordinates and the computed radar antenna reference coordinates values. Optionally, but in some embodiments preferably, the fitting procedure utilizes least mean squares minimization. In this way effective and accurate bias values can be obtained for calibrating a rotating antenna system in all possible angular orientations thereof, where the antenna is not externally viewable and without requiring global positioning data.

For an overview of several example features, process stages, and principles of the invention, the exemplary embodiments for determining antenna orientation and its distance from a target element illustrated schematically and diagrammatically in the figures are intended for calibration of radar antennas. These orientation and position measuring systems are shown as one example implementation that demonstrates a number of features, processes, and principles used to determine calibration bias values for a rotating radar antenna, but they are also useful for other applications and can be made in different variations. Therefore, this description will proceed with reference to the shown radar antenna examples, but with the understanding that the invention recited in the claims below can also be implemented in myriad other ways and for calibrating other types of movable antennas, once the principles are understood from the descriptions, explanations, and drawings herein. All such variations, as well as any other modifications apparent to one of ordinary skill in the art and useful in antenna calibration applications may be suitably employed, and are intended to fall within the scope of this disclosure.

FIG. 1 schematically illustrates a calibration setup 10 using a reference target element (RFT) for determining calibration bias values for a rotatable antenna system 10s. The antenna system 10s comprises a rotatable support 11 configured to position the antenna 12 mounted thereon in a determined orientation, wherein the antenna 12 is enclosed inside an optically opaque structure 12r (e.g., Radome). Each angular movement of the rotatable support 11 thus results in a change of at least the vector $\bar{x}_{RFT,APC}$ between the phase center APC of the antenna 12 and the reference target RFT, and the azimuth $Az_p$ of the antenna i.e., the angle between the north direction N and the orthogonal projection Vzh of antenna broad side vector 12b (being normal to the surface of the antenna 12t) onto the horizontal plane 15. The elevation angle $El_a$ of the radar antenna 12 i.e., the angle between the antenna broad side vector 12b and its orthogonal projection Vzs onto the rotatable support plane 13, is indicative of antenna broad side vector position in the vertical plane.

If the plane 13 of the rotatable support 11 is not parallel to the horizontal plane 15 then the following angles are also changed in each angular movement of the rotatable support 11:
- the roll tilt angle $T_r$ of the rotatable support 11 changed due to rotation of the rotatable support 11 about the vector $\bar{v}_{zs}$.
- the pitch tilt angle $T_p$ of the rotatable support 11 i.e., the angle between the orthogonal projection of the antenna broad side vector 12b onto the horizontal plane 15 (Vzh) and its orthogonal projection onto the plane 13 of the rotatable support 11 (Vzs);

In a calibration tower setups of a possible embodiment, the RFT is mounted on a stationary tower/post, and exact geographic locations of the RFT and of the APC are obtained using global positioning systems for determining calibration bias values. The calibration schemes of the embodiments disclosed hereinbelow don't rely on global positioning systems. Instead, optical surveying equipment is used to determine reference data for calibrating the antenna system 10s. However, since the antenna 12 is enclosed inside the protective structure 12r it is not viewable by optical surveying equipment, the reference data is determined using the optical surveying equipment to measure polar coordinates of a reference point on the rotatable support 11. Optionally, but in some embodiments preferably, the reference point measured on the rotatable support 11 is the center of the rotatable support 11 (also referred to herein as pedestal azimuth revolving center—PARC).

Figure 2:
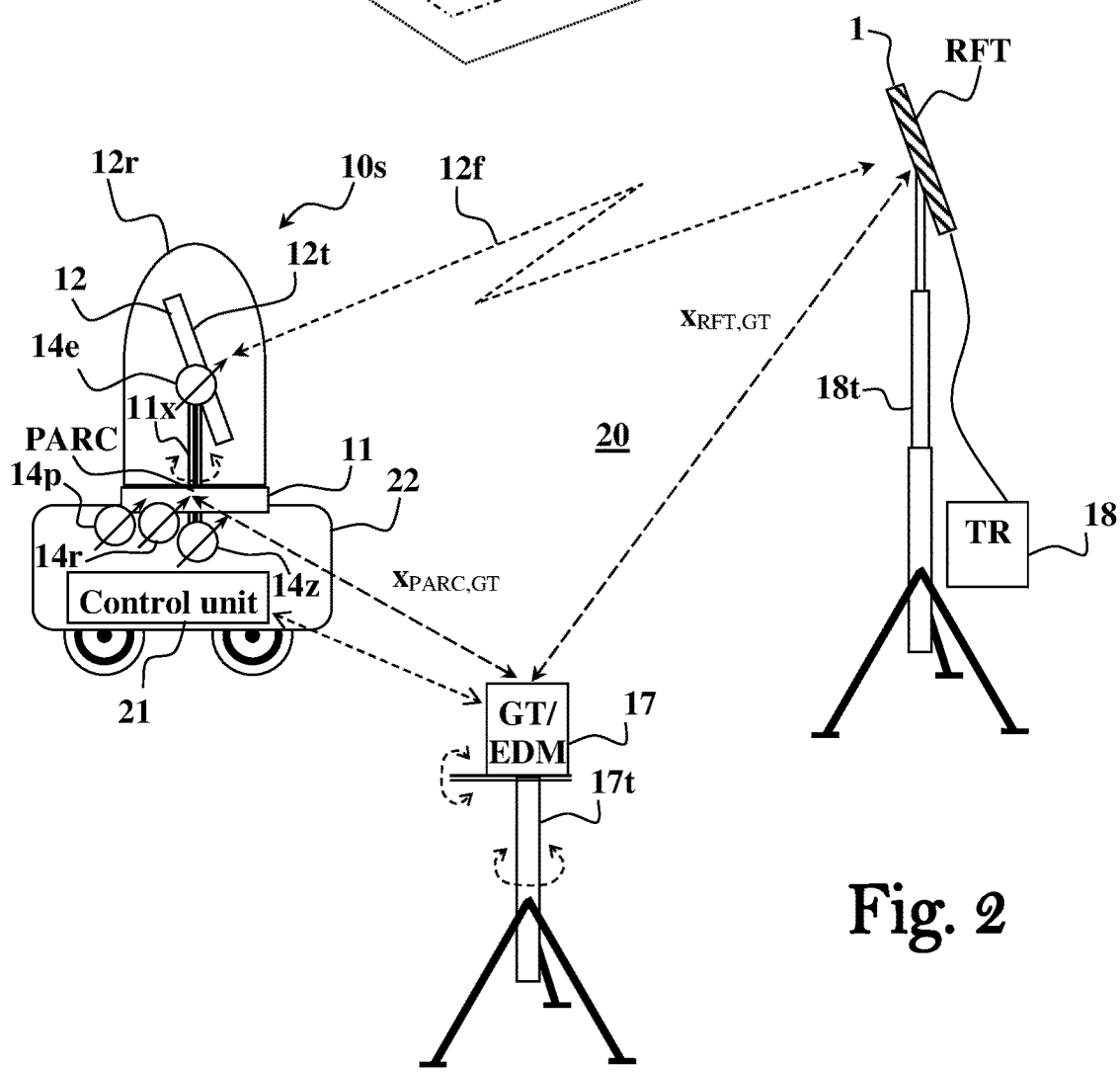
FIG. 2 schematically illustrates an antenna calibration setup according to some possible embodiments.

FIG. 2 schematically illustrates a calibration setup 20 for calibration of the radar antenna 12. The calibration setup 20 comprises a stationary reference target element 1 (RFT) (e.g., mounted on a post/tripod 18t), and coupled to a transponder 18, which returns electromagnetic echo signals transmitted by radar to the radar antenna direction, and a stationary surveying system 17 (e.g., mounted on a post/tripod 17t). Though in this specific and non-limiting example the radar antenna 12 is mounted on a movable platform/vehicle 22, during the calibration process, the antenna movable platform/vehicle 22 is stationary, such that only rotational movements of the antenna 12 about its shaft 11x are affected. After the calibration process the movable platform/vehicle 22 can be moved to a new location, if so needed, and the antenna can be operated at the new location using the determined bias values. Optionally, at least one of the reference target element (RFT) and the optical surveying system 17, is also mounted on a movable platform/vehicle, but also remain stationary during the calibration process.

The radar antenna system 10s comprises one or more sensors used for measuring its orientation angles. In some embodiments at least one azimuth angle sensor device 14z is used for measuring the azimuth ($Az_{pm}$) of the rotatable support 11, at least one sensor device 14e is used for measuring the elevation angle ($El_{am}$) of the antenna 12 relative to rotatable support 11, at least one roll tilt sensor 14r is used to measure the tilt roll angle ($T_{rm}$) of the rotatable support 11, and at least one pitch tilt sensor 14p is used to measure the tilt pitch angle ($T_{pm}$) of the rotatable support 11.

A control unit 21 can be used to receive measured data/signals from the orientation sensor devices of the orientation measurement system ($El_{am}$ from 14e, $Az_{pm}$ from 14z, $T_{rm}$ from 14r, $T_{pm}$ from 14p), from the optical surveying system 17, and electromagnetic echo signals 12f received by the radar antenna 12 from the reference target element 1 (RFT), and determine based thereon at least one of the following calibration bias values: an azimuth bias ($B_{Az}$) for calibrating a measured azimuth angle of the rotatable support ($Az_{pm}$), an elevation bias ($B_{El}$) for calibrating a measured elevation angle of the antenna ($El_{am}$), a roll tilt angle bias ($B_{Tr}$) for calibrating a measured roll tilt angle of the antenna ($T_{rm}$), a radar antenna measured azimuth bias ($B_u$) for calibrating a radar antenna measured azimuth ($u_m$) value of the reference target, a radar antenna measured elevation bias ($B_v$) for calibrating a measured radar antenna elevation angle ($v_m$) values of the reference target, and a radar antenna measured range/distance bias ($B_r$) for calibrating a measured radar antenna range/distance ($x_{RFT,APC}$) values of the reference target. The measured data from the sensor devices of the orientation measurement system ($Az_{pm}$, $El_{am}$, $T_{rm}$, and $T_{pm}$) is also referred to herein as orientation data (OD). The measured data from the target location measurement system of the radar antenna 12 (12f) (measured antenna coordinates of RFT) is also referred to herein as antenna measurement data (MD).

The optical surveying system 17 can be a type of total surveying station comprising a gyro theodolite (GT) and an electronic distance measurement (EDM) meter, configured for measuring the Geographic polar coordinates [$P_{RFT,GT}$] of the vector $x_{RFT,GT}$ relative to a reference location of the optical surveying system 17 i.e., the vector between the reference target (RFT) and the gyro theodolite (GT), and for measuring the Geographic polar coordinates [$P_{PARC,GT}$] of the vector $x_{PARC,GT}$ relative to the reference location of the optical surveying system 17 i.e., the vector between the center of the rotatable support (PARC) and the gyro theodolite (GT). The Geographic polar coordinates of the vector $x_{RFT,GT}$ can be presented as follows:

$$P_{RFT,GT}=[Az_{RFT,GT}, El_{RFT,GT}, R_{RFT,GT}]$$

where $Az_{RFT,GT}$ is the Geographic azimuth of the RFT relative to the GT, $El_{RFT,GT}$ is the Geographic elevation of the RFT relative to the GT, and $R_{RFT,GT}$ is the distance between the RFT and the GT. Similarly, the vector $x_{PARC,GT}$ can be presented as follows:

$$P_{PARC,GT}=[Az_{PARC,GT}, El_{PARC,GT}, R_{PARC,GT}]$$

where $Az_{PARC,GT}$ is the Geographic azimuth of the PARC relative to the GT, $El_{PARC,GT}$ is the Geographic elevation of the PARC relative to the GT, and $R_{PARC,GT}$ is the distance between the PARC and the GT]). The data measured by the optical surveying system 17 is also referred to herein as reference data (RD), which is used for computing the radar antenna reference coordinates of the reference target (RFT).

Figure 3:
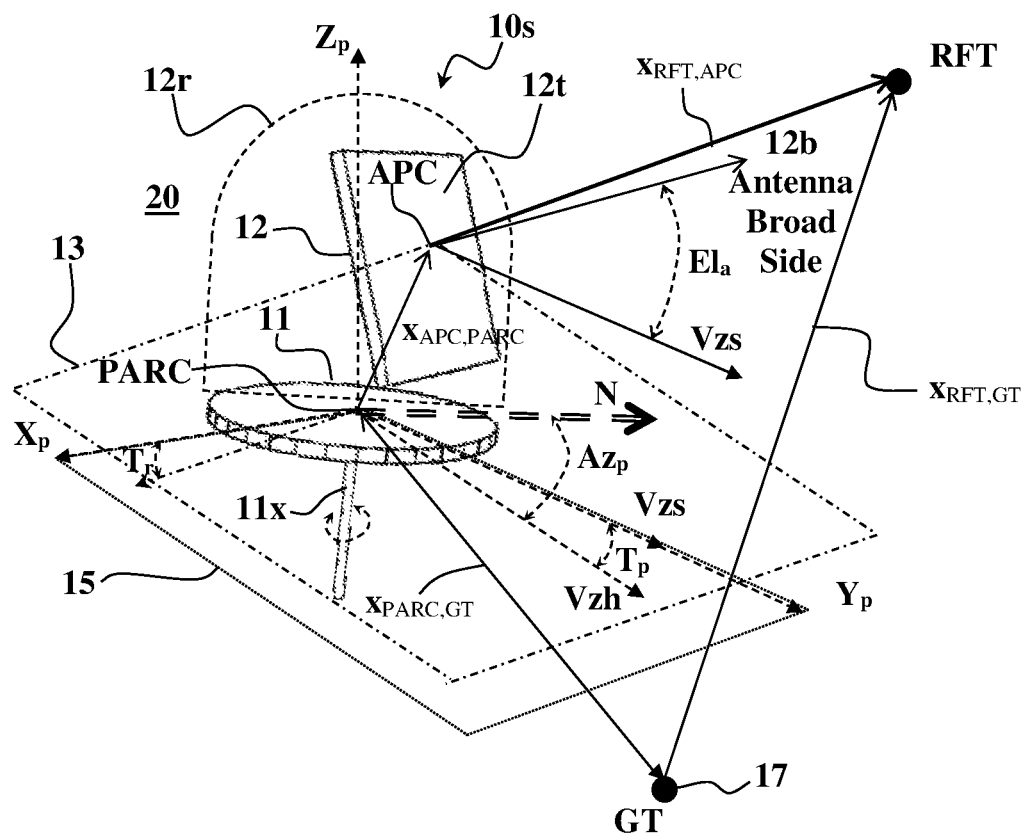
FIG. 3 schematically illustrates an antenna calibration technique usable with the calibration setup of FIG. 2.

FIG. 3 shows vector representation of the positions measured by the optical surveying system 17 in the calibration process in some possible embodiments, utilizing the calibration setup 20 shown in FIG. 2. In this embodiment the pedestal azimuth revolving center (PARC) is used as the reference point on the rotatable support 11. Polar coordinates of the PARC are measured by the optical surveying system 17.

The calibration process in some embodiments requires calculation of the RFT vector relative to the antenna phase center (APC) ($x_{RFT,APC}$), using the vector of APC relative to the PARC ($x_{APC,PARC}$) The $x_{RFT,APC}$ vector can be calculated as follows:

$$x_{RFT,APC}=x_{RFT,GT}-x_{PARC,GT}-x_{APC,PARC}$$

For each new angular position of the support platform a new $x_{APC,PARC}$ vector is computed based on the geometrical dimensions of the antenna, the position of the radar antenna with respect to the support platform, and/or antenna orientation parameters measured by the antenna orientation measurement system (e.g., the measured elevation angle of the antenna, $El_{am}$). In some possible embodiments the size of the $x_{APC,PARC}$ vector (i.e., the distance between the center of the support platform and the antenna phase center) remains substantially unchanged, and only its direction is changed for each angular movement of the support platform.

The $x_{RFT,GT}$ and $x_{PARC,GT}$ vectors are measured by the GT 17, and the vector $x_{APC,PARC}$ in Geographic Cartesian coordinates with origin at the PARC ($x_{APC,PARC,ggc}$) is a function of the antenna dimensions and its position relative to the rotatable support 11, and of the antenna orientation parameters: azimuth angle of the rotatable support ($Az_p$), antenna elevation angle ($El_a$), roll tilt angle ($T_r$) and pitch tilt angle ($T_p$). Hence the system needs to determine the vector $x_{APC,PARC,ggc}$ for each set of the antenna angular position parameters. Calculation of the vector $x_{APC,PARC,ggc}$ can be carried out, using the parameters measured by the antenna orientation measurement system parameters, by performing the following steps:

determining coordinates of the APC relative to the PARC ($x_{APC,PARC,p}=[X_{APC,PARC,p}\ Y_{APC,PARC,p}\ Z_{APC,PARC,p}]$) in the coordinate system of the rotatable support with origin at the PARC, that are a functions of the antenna dimensions, its position relative to the rotatable support 11, and the antenna elevation (EL);

determining $x_{APC,PARC,ggc}=[X_{APC,PARC}\ Y_{APC,PARC}\ Z_{APC,PARC}]$ in Geographic Cartesian coordinates with origin at the PARC, by revolving the coordinate system of the rotatable support about its coordinate system axis, according to the orientation angles of the support platform measured by the antenna orientation measurement system.

Particularly, the elements of the transformation performed to determine the Geographic Cartesian coordinates of $x_{APC,PARC,ggc}$ are functions of the measured rotatable support position angular parameters ($Az_p$, $T_r$ and $T_p$). The $x_{APC,PARC,ggc}$ vector can be determined by the following computation:

$$x_{APC,PARC,ggc}=x_{APC,PARC,p} \cdot TGP;$$

where TGP is Geographic Cartesian to rotatable support coordinates transformation matrix, which can be calculated for each position of the rotatable support as follows:

$$TGP = \begin{bmatrix} c_{11} & c_{12} & c_{13} \\ c_{21} & c_{22} & c_{23} \\ c_{31} & c_{32} & c_{33} \end{bmatrix}$$

$c_{11} = -\sin(Az_p) \cdot \cos(T_r + \cos(Az_p) \cdot \sin(T_p) \cdot \sin(T_r)$, $c_{12} = -\cos(Az_p) \cdot \cos(T_r) - \sin(Az_p) \cdot \sin(T_p) \cdot \sin(T_r)$, $c_{13} = -\cos(T_p) \cdot \sin(T_r)$, $c_{21} = \cos(Az_p) \cdot \cos(T_p)$, $c_{22} = -\sin(Az_p) \cdot \cos(T_p)$, -continued $c_{23} = \sin(T_p)$, $c_{31} = -\sin(Az_p) \cdot \sin(T_r) - \cos(Az_p) \cdot \sin(T_p) \cdot \cos(T_r)$, $c_{32} = -\cos(Az_p) \cdot \sin(T_r) + \sin(Az_p) \cdot \sin(T_p) \cdot \cos(T_r)$, $c_{33} = \cos(T_p) \cdot \cos(T_r)$, Assuming the surveying equipment 17 provides the following reference data:
  azimuth of the PARC relative to the GT ($Az_{PARC,GT}$)
  elevation of the PARC relative to the GT ($El_{PARC,GT}$)
  distance from the PARC to the GT ($R_{PARC,GT}$)
  azimuth of the RFT relative to the GT ($Az_{RFT,GT}$)
  elevation of the RFT relative to the GT ($El_{RFT,GT}$)
  distance from the RFT to the GT ($R_{RFT,GT}$), Thus Geographic Cartesian coordinates of the PARC vector relative to the GT ($x_{PARC,GT}$) ($x_{PARC,GT,ggc}$=[$X_{PARC,GT}$ $Y_{PARC,GT}$ $Z_{PARC,GT}$]) can be calculated by transforming the polar coordinates of the PARC measured by the surveying equipment 17 into Geographic Cartesian coordinates, as follows:

$X_{PARC,GT} = R_{PARC,GT} \cdot \cos(El_{PARC,GT}) \cdot \cos(Az_{PARC,GT})$ $Y_{PARC,GT} = -R_{PARC,GT} \cdot \cos(El_{PARC,GT}) \cdot \sin(Az_{PARC,GT})$ $Z_{PARC,GT} = R_{PARC,GT} \cdot \sin(El_{PARC,GT})$, and Geographic Cartesian coordinates of the RFT vector relative to GT ($x_{PARC,GT}$) ($x_{RFT,GT,ggc}$=[$X_{RFT,GT}$ $Y_{RFT,GT}$ $Z_{RFT,GT}$]) can be calculated by transforming the polar coordinates of the RFT measured by the surveying equipment 17 into Geographic Cartesian coordinates, as follows:

$X_{RFT,GT} = R_{RFT,GT} \cdot \cos(El_{RFT,GT}) \cdot \cos(Az_{RFT,GT})$ $Y_{RFT,GT} = -R_{RFT,GT} \cdot \cos(El_{RFT,GT}) \cdot \sin(Az_{RFT,GT})$ $Z_{RFT,GT} = R_{RFT,GT} \cdot \sin(El_{RFT,GT})$.

By using Geographic Cartesian coordinates of the APC and of the RFT vectors relative to the GT, and Geographic Cartesian coordinates of the APC vector relative to the PARC, the system can determine Geographic Cartesian coordinates of the RFT relative to the APC for a specific angular position/orientation of the rotatable support 11, as follows:

$x_{RFT,APC,ggc}(Az_p,El_a,T_r,T_p) = x_{RFT,GT,ggc} - x_{PARC,GT,ggc} - x_{APC,PARC,ggc}(Az_p,El_a,T_r,T_p)$. (1)

In some embodiments the computed reference coordinates of the RFT ($x_{RFT,APC,ggc}$) are transformed into the radar antenna measurement coordinate system (e.g., polar, sine space) relative to the plane of the antenna 12.

For example, if the radar antenna measurement coordinate system is a sine space coordinate system, then the coordinates of the Geographic Cartesian coordinates of the RFT relative to the APC, $x_{RFT,APC,ggc}$, should be transformed into the radar antenna sine space coordinate system, designated as $S_{RFT,APC}$,r=[$u_r$ $v_r$ $r_r$]. This transformation can be carried out by the following steps:
  transformation from Geographic Cartesian coordinates ($x_{RFT,APC,ggc}$=[$X_{RFT,APC}$ $Y_{RFT,APC}$ $Z_{RFT,APC}$]) into Geographic polar antenna coordinate system ($P_{RFT,APC}$=[$Az_{RFT,APC}$ $El_{RFT,APC}$ $R_{RFT,APC}$]):

$Az_{RFT,APC}(Az_p,El_a,T_r,T_p) = 2 \cdot \pi - \text{ARCTAN}(X_{RFT,APC}Y_{RFT,APC})$ $El_{RFT,APC}(Az_p, El_a, T_r, T_p) = \text{ARCSIN}\left(\frac{Z_{RFT,APC}}{R_{RFT,APC}}\right)$ (2)

$R_{RFT,APC}(Az_p, El_a, T_r, T_p) = \sqrt{(X_{RFT,APC})^2 + (Y_{RFT,APC})^2 + (Z_{RFT,APC})^2}$, where: ARCTANQ is the inverse tangent function and ARCSINQ is the inverse sinus function.
transformation from Geographic polar antenna coordinates to radar antenna sine space coordinates ($S_{RFT,APC}$,r=[$u_r$ $v_r$ $r_r$]):

$u_r = B_1 \cdot P_r$, $v_r = B_3 \cdot P_r$, $r_r = R_{RFT,APC}(Az_p, El_a, T_r, T_p)$, (3)

where:

$B_1 = [b_{11} \; b_{12} \; b_{13}]$, $b_{11} = -\sin Az_p \cdot \cos T_r + \cos Az_p \cdot \sin T_p \cdot \sin T_r$, $b_{12} = -\sin Az_p \cdot \sin T_p \cdot \sin T_r - \cos Az_p \cdot \cos T_r$, $b_{13} = -\cos T_p \cdot \sin T_r$, $B_3 = [b_{31} \; b_{32} \; b_{33}]$, $b_{31} = -\sin Az_p \sin T_r \cdot \cos El_a - \cos Az_p \cdot (\cos T_p \sin El_a + \sin T_p \cdot \cos T_r \cdot \cos El_a)$, $b_{32} = \sin Az_p \cdot (\cos T_p \cdot \sin El_a + \sin T_p \cdot \cos T_r \cdot \cos EL_a) - \cos Az_p \cdot \sin T_r \cdot \cos El_a$, $b_{33} = -\sin T_p \cdot \sin El_a + \cos T_p \cdot \cos T_r \cdot \cos El_a$, $P_r = [p_{r1} \; p_{r2} \; p_{r3}]^T$, $p_{r1}(Az_p,El_a,T_r,T_p) = \cos(El_{RFT,APC}) \cdot \cos(Az_{RFT,APC})$, $p_{r2}(Az_p,El_a,T_r,T_p) = -\cos(El_{RFT,APC}) \cdot \sin(Az_{RFT,APC})$, $p_{r3}(Az_p,El_a,T_r,T_p) = \sin(El_{RFT,APC,i})$, The calibration process is based on the fact that there are bias values ($B_{Az}$, $B_{El}$ and $B_{Tr}$) of the orientation parameters ($Az_{pm}$, $El_{am}$ and $T_{rm}$) measured by the orientation sensors of the orientation measurement system, and bias values ($B_u$, $B_v$ and $B_r$) of the radar system coordinates of the reference target ($u_m$, $v_m$ and $r_m$) measured by the target location measurement system of the radar system from the electromagnetic echo signals (12*f*) received by the radar antenna 12 from the RFT. These bias values can be used to correct the radar orientation parameters measured by the orientation measurement system, and the radar system coordinates of the reference target measured by the target location measurement system of the radar system, in substantially any possible orientation of the radar antenna and possible target position.

Accordingly, upon determining the bias values of the antenna orientation parameters, and of the radar system coordinates of the reference target, after each angular movement of the rotatable support 11 the following correction is carried out:
  determine the corrected orientation parameters ($Az_{pc}$, $El_{ac}$, $T_{rc}$, $T_{pc}$), as follows:

$Az_{pc} = Az_{pm} + B_{Az}$, $El_{ac} = El_{am} + B_{El}$, $T_{rc}=T_{rm}+B_{Tr}$, $T_{pc}=T_{pm}$;  (4)

determine the corrected radar system measured coordinates of the reference target $[u_c, v_c, r_c]$, as follows:

$u_c=u_m+B_u$, $v_c=v_m+B_v$, $r_c=r_m+B_r$.  (5)

In some embodiments the bias values for the orientation parameters and for the radar system measured coordinates of the RFT are determined by a fitting process configured to minimize the errors/deviations between:
  (i) the corrected measured radar system coordinates $[u_c\ v_c\ r_c]$ as determined by equation (5) above based on the electromagnetic echo signal(s) 12f received by the radar antenna 12 from the RFT (also referred to herein as corrected measurement coordinates); and
  (ii) the calculated radar system coordinates of the RFT relative to the APC $[u_r\ v_r\ r_r]$, as determined from the orientation parameters by equations (1-3) (also referred to herein as reference coordinates).

For example, upon determining several (n) sets of the orientation parameters according to equation (4), the corrected orientation parameters $(Az_{pc,i}, El_{ac,i}, T_{rc,i}, T_{pc,i})$ can computed as follows:

$Az_{pc,i}=Az_{pm,i}+B_{Az}$, $El_{ac,i}=El_{am,i}+B_{El}$, $T_{rc,i}=T_{rm,i}+B_{Tr}$,
$1 \le i \le n$ (where $i$ and $n$ are integers)

and the following data:
  a corresponding set of reference vectors $[u_{r,i}, v_{r,i}, r_{r,i}]$, obtained from equations (1-3) for the set of the corrected orientation parameters;
  a corresponding set of radar corrected measured vectors $[u_{mc,i}, v_{mc,i}, r_{mc,i}]$, derived from the electromagnetic echo signal(s) 12f received by the radar antenna 12 from the RFT and calculated according to (5).

A fitting process utilizing a root mean square fitting scheme can be used to minimize the function:

$L(B_{Az},B_{El},B_{Tr},B_u,B_v,B_r)=\sum_{i=1}^n[(u_{mc,i}-u_{r,i})^2+(v_{mc,i}-v_{r,i})^2+(r_{mc,i}-r_{r,i})^2]$  (6).

The following expressions are used in this in this specific and non-limiting example:

$$F_1(B_{Az}, B_{El}, B_{Tr}, B_r, B_u, B_v) = 0.5 \cdot \frac{\partial L(B_{Az}, B_{El}, B_{Tr}, B_r, B_u, B_v)}{\partial B_{Az}} = \\ -\sum_{i=1}^n \left[ du_{c,i} \cdot \frac{\partial u_{r,i}}{\partial B_{Az}} + dv_{c,i} \cdot \frac{\partial v_{ri,i}}{\partial B_{Az}} + dr_{c,i} \cdot \frac{\partial r_{r,i}}{\partial B_{Az}} \right]$$  (7)

$$F_2(B_{Az}, B_{El}, B_{Tr}, B_r, B_u, B_v) = 0.5 \cdot \frac{\partial L(B_{Az}, B_{El}, B_{Tr}, B_r, B_u, B_v)}{\partial B_{El}} = \\ -\sum_{i=1}^n \left[ du_{c,i} \cdot \frac{\partial u_{r,i}}{\partial B_{El}} + dv_{c,i} \cdot \frac{\partial v_{ri,i}}{\partial B_{El}} + dr_{c,i} \cdot \frac{\partial r_{r,i}}{\partial B_{El}} \right]$$

$$F_3(B_{Az}, B_{El}, B_{Tr}, B_r, B_u, B_v) = 0.5 \cdot \frac{\partial L(B_{Az}, B_{El}, B_{Tr}, B_r, B_u, B_v)}{\partial B_{Tr}} = \\ -\sum_{i=1}^n \left[ du_{c,i} \cdot \frac{\partial u_{r,i}}{\partial B_{Tr}} + dv_{c,i} \cdot \frac{\partial v_{ri,i}}{\partial B_{Tr}} + dr_{c,i} \cdot \frac{\partial r_{r,i}}{\partial B_{Tr}} \right]$$

$$F_4(B_{Az}, B_{El}, B_{Tr}, B_r, B_u, B_v) = \\ 0.5 \cdot \frac{\partial L(B_{Az}, B_{El}, B_{Tr}, B_r, B_u, B_v)}{\partial B_r} = \sum_{i=1}^n dr_{c,i}$$

$$F_5(B_{Az}, B_{El}, B_{Tr}, B_r, B_u, B_v) = \\ 0.5 \cdot \frac{\partial L(B_{Az}, B_{El}, B_{Tr}, B_r, B_u, B_v)}{\partial B_u} = \sum_{i=1}^n du_{c,i}$$

$$F_6(B_{Az}, B_{El}, B_{Tr}, B_r, B_u, B_v) = \\ 0.5 \cdot \frac{\partial L(B_{Az}, B_{El}, B_{Tr}, B_r, B_u, B_v)}{\partial B_v} = \sum_{i=1}^n dv_{c,i},$$

where: $du_{c,i}=u_{c,i}-u_{r,i}$, $dv_{c,i}=v_{c,i}-v_{r,i}$, $dr_{c,i}=r_{c,i}-v_{r,i}$, and $u_{c,i}, v_{c,i}$, and $r_{c,i}$ are determined as defined in equation (5), the derivatives $$\frac{\partial u_{r,i}}{\partial B_{Az}}, \frac{\partial v_{r,i}}{\partial B_{Az}}, \frac{\partial r_{r,i}}{\partial B_{Az}}, \frac{\partial u_{r,i}}{\partial B_{El}}, \frac{\partial v_{r,i}}{\partial B_{El}}, \frac{\partial r_{r,i}}{\partial B_{El}}, \frac{\partial u_{r,i}}{\partial B_{Tr}}, \frac{\partial v_{r,i}}{\partial B_{Tr}}, \text{and } \frac{\partial r_{r,i}}{\partial B_{Tr}}$$

are functions of the orientation parameters: $Az_{pc,i}, El_{ac,i}, Tr_{c,i}, T_{pc,i}$, which can be computed by equations (1)-(3), and $Az_{pc,i}, El_{ac,i}, T_{rc,i}, T_{pc,i}$ can be calculated by equation (4).

In this case the required biases can be found as a solution of the following system of equations:

$F_k(B_{Az},B_{El},B_{Tr},B_r,B_u,B_v)=0$, where $1 \le k \le 6$ in an integer  (8)

This equations system (8) can be solved by an iterative process, as follows:
  1. In a first step it is assumed that the biases are zeroed:

$B_{Az}^1=0$, $B_{El}^1=0$, $B_{Tr}^1=0$, $B_r^1=0$, $B_u^1=0$, $B_v^1=0$.

2. Next, a solution of the of the following equations system is computed:

$$M^j \cdot \begin{bmatrix} \delta_{Baz} \\ \delta_{Bel} \\ \delta_{Btr} \\ \delta_{Br} \\ \delta_{Bu} \\ \delta_{Bv} \end{bmatrix} = - \begin{bmatrix} F_1^j \\ F_2^j \\ F_3^j \\ F_4^j \\ F_5^j \\ F_6^j \end{bmatrix},$$  (9)

where:

$$M^j = \begin{bmatrix} \frac{\partial F_1^j}{\partial B_{Az}} & \frac{\partial F_1^j}{\partial B_{El}} & \frac{\partial F_1^j}{\partial B_{Tr}} & \frac{\partial F_1^j}{\partial B_r} & \frac{\partial F_1^j}{\partial B_u} & \frac{\partial F_1^j}{\partial B_v} \\ \frac{\partial F_2^j}{\partial B_{Az}} & \frac{\partial F_2^j}{\partial B_{El}} & \frac{\partial F_2^j}{\partial B_{Tr}} & \frac{\partial F_2^j}{\partial B_r} & \frac{\partial F_2^j}{\partial B_u} & \frac{\partial F_2^j}{\partial B_v} \\ \frac{\partial F_3^j}{\partial B_{Az}} & \frac{\partial F_3^j}{\partial B_{El}} & \frac{\partial F_3^j}{\partial B_{Tr}} & \frac{\partial F_3^j}{\partial B_r} & \frac{\partial F_3^j}{\partial B_u} & \frac{\partial F_3^j}{\partial B_v} \\ \frac{\partial F_4^j}{\partial B_{Az}} & \frac{\partial F_4^j}{\partial B_{El}} & \frac{\partial F_4^j}{\partial B_{Tr}} & \frac{\partial F_4^j}{\partial B_r} & \frac{\partial F_4^j}{\partial B_u} & \frac{\partial F_4^j}{\partial B_v} \\ \frac{\partial F_5^j}{\partial B_{Az}} & \frac{\partial F_5^j}{\partial B_{El}} & \frac{\partial F_5^j}{\partial B_{Tr}} & \frac{\partial F_5^j}{\partial B_r} & \frac{\partial F_5^j}{\partial B_u} & \frac{\partial F_5^j}{\partial B_v} \\ \frac{\partial F_6^j}{\partial B_{Az}} & \frac{\partial F_6^j}{\partial B_{El}} & \frac{\partial F_6^j}{\partial B_{Tr}} & \frac{\partial F_6^j}{\partial B_r} & \frac{\partial F_6^j}{\partial B_u} & \frac{\partial F_6^j}{\partial B_v} \end{bmatrix}$$

$F_k^j$ and $$\frac{\partial F_k^j}{\partial \ldots}$$

are values of the expressions $F_k$ of equation (7) and it's correspondent derivatives in the $j^{th}$ iteration, and the derivatives $$\frac{\partial F_k^j}{\partial \ldots}$$

can be determined by equation (1)-(3) and (7).

3. Then, new biases values can be calculated, as follows:
$B_{Az}^{j+1}=B_{Az}^j+\delta_{Baz}^j$, $B_{El}^{j+1}=B_{El}^j+\delta_{Bel}^j$, $B_{Tr}^{j+1}=B_{Tr}^j+\delta_{Btr}^j$,
$B_r^{j+1}=B_r^j+\delta_{Br}^j$, $B_u^{j+1}=B_u^j+\delta_{Bu}^j$, $B_v^{j+1}=B_v^j+\delta_{Bv}^j$,
where: $\delta_{Baz}^j$, $\delta_{Bel}^j$, $\delta_{Btr}^j$, $\delta_{Br}^j$, $\delta_{Bu}^j$, and $\delta_{Bv}^j$ are solution of the system of equations (9) in the $j^{th}$ iteration.

4. If $$\sqrt{\left(\frac{\delta_{Baz}^j}{\sigma_{az}}\right)^2 + \left(\frac{\delta_{Bel}^j}{\sigma_{el}}\right)^2 + \left(\frac{\delta_{Btr}^j}{\sigma_{tr}}\right)^2 + \left(\frac{\delta_{Br}^j}{\sigma_r}\right)^2 + \left(\frac{\delta_{Bu}^j}{\sigma_u}\right)^2 + \left(\frac{\delta_{Bv}^j}{\sigma_v}\right)^2} < D,$$

then step 5 is carried out, otherwise the process returns to step 2 (where $\sigma_{az}$, $\sigma_{el}$, $\sigma_{tr}$, $\sigma_r$, $\sigma_u$, and $\sigma_v$ are standard deviations of the measurement errors of the required biases of $Az_p$, $El_a$, $T_r$, r, u and v).

5. The solution of the system of equations (9) is determined to be:

$B_{Az}=B_{Az}^{j+1}$, $B_{El}=B_{El}^{j+1}$, $B_{Tr}=B_{Tr}^{j+1}$, $B_r=B_r^{j+1}$,
$B_u=B_u^{j+1}$, $B_v=B_v^{j+1}$.

Corrected orientation parameters ($Az_p$, $El_a$, $T_r$) and target's sine space coordinates [u,v,r] can be calculated the results obtained in steps (4) and (5), as follows:

$Az_{pc}=Az_{pm}+B_{Az}$, $El_{ac}=El_{am}+B_{El}$, $T_{rc}=T_{rm}+B_{Tr}$, $r_c=r_m+B_r$, $u_c=u_m+B_u$, $v_c=v_m+B_v$, where $Az_{pm}$, $El_{am}$ and $T_{rm}$, are orientation parameters measured values, and $u_m$, $v_m$, and $r_m$, are reference target's sine space measured coordinates.

All of the biases can be constant values or functions constructed from the antenna orientation parameters and beam boresight directions coordinates relative to the radar antenna.

Figure 4:
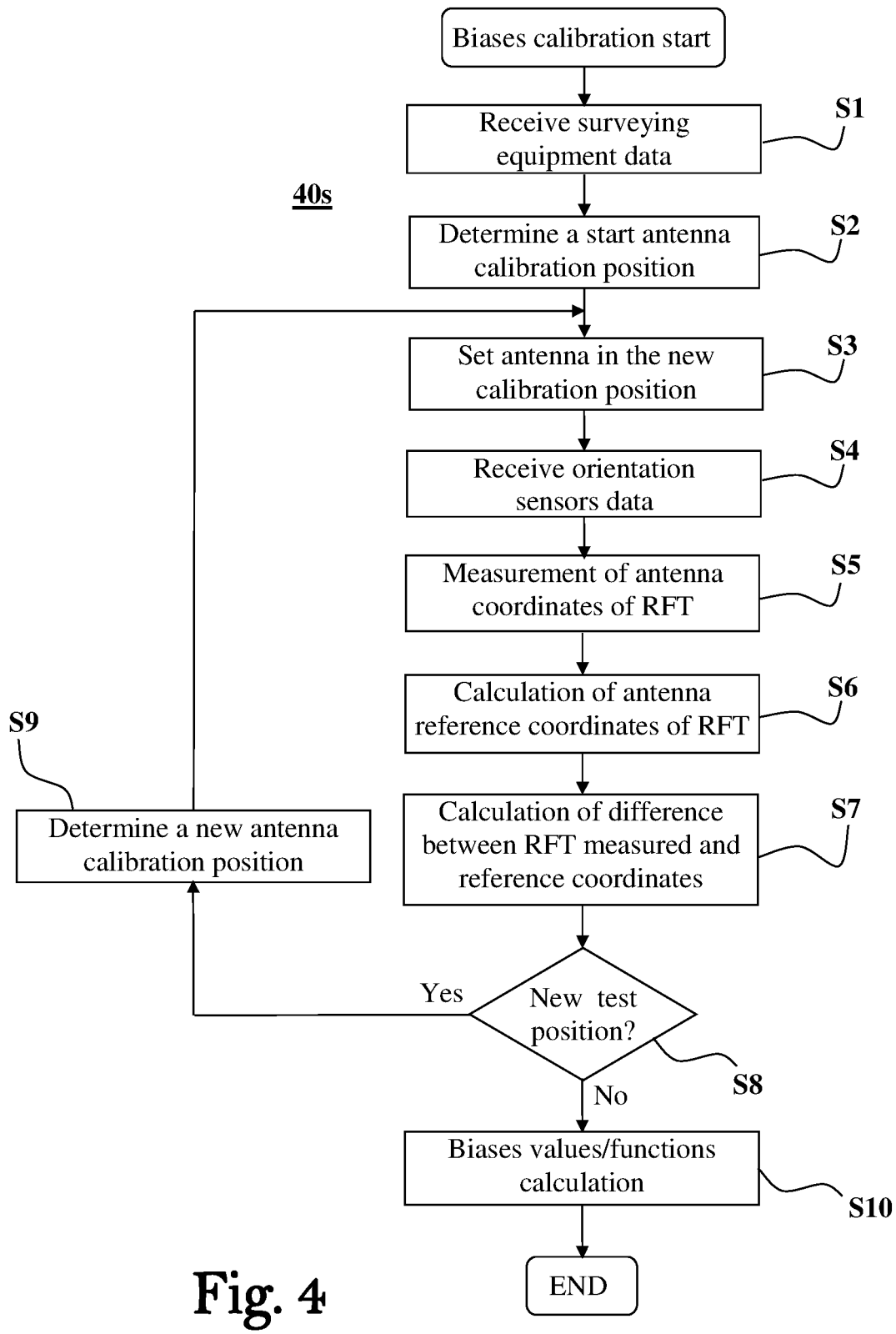
FIG. 4 is a flowchart schematically illustrating an antenna calibration process according to some possible embodiment.

FIG. 4 is a flowchart of a process 40s of determining bias values/functions for a radar antenna system (10s). The bias values/functions determination process 40s starts in block S1 wherein the reference data/signals $x_{RFT,GT}$ and $x_{PARC,GT}$, indicative of the coordinates of the RFT and of the PARC, relative to the GT, is received from the surveying equipment (17). Next, in block S2 start antenna calibration position is defined, and in block S3 the rotatable support (11) is turned to define new orientation of the radar antenna (12), if it is not already so oriented. Once the radar antenna is positioned in its new orientation, in block S4 orientation data from the sensors of the antenna orientation measurement system is collected, and in step S5 antenna coordinates measurement data of the RFT is collected, by receiving the data/signals from the radar antenna (12) indicative of the electromagnetic echo radiation received by the radar antenna (12) from the RFT.

In block S6 the reference antenna coordinates of the RFT are calculated based on the data/signals $x_{RFT,GT}$ and $x_{PARC,GT}$ received in block S1 from the surveying equipment, and the orientation sensor data received in block S4 from the antenna orientation measurement system, to determine the measurement errors/deviations. Block S6 can thus include transformation(s) of coordinates from one coordinate system to another, as may be required per specific implementation. Next, in block S7, difference between measured and reference coordinates of the RFT is determined. If, according to block S8, measured and reference data for two or more different antenna orientations are required to determine the biases values/functions (i.e., n≥2), than in block S9 a new angular position of the rotatable support is determined, and the control is then transferred back to blocks S3 to S8 for moving the antenna into the new position, obtaining the respective orientation and measurement data, and determining respective measurement errors/deviation. The loop of blocks S3 to S8 can be repeated a number of times, until the data/signals for the required number of different antenna orientations are obtained. If it is determined in block S8 that sufficient measured and reference data has been collected, block S10 starts a fitting process, which defines the biases values/functions to minimize or substantially eliminate/zero the measurements errors/deviations.

Optionally, the control unit (21) is configured and operable to determine if additional orientation and measurement data/signals is needed for accurate determination of the biases values/functions, e.g., for example, if the matrix of system equations (9) is well determined (e.g., if Det[M]>0, or optionally if Det[M]>A, wherein A is a predetermined threshold value, and Det[M] designate determinant of the matrix M obtained from the last iteration), then it is assured that the collected data is sufficient to accurately determine the bias values/functions. In some possible embodiments three different antenna orientations (i.e., n=3) are sufficient for accurate determination of the bias values/functions definition.

Figure 5:
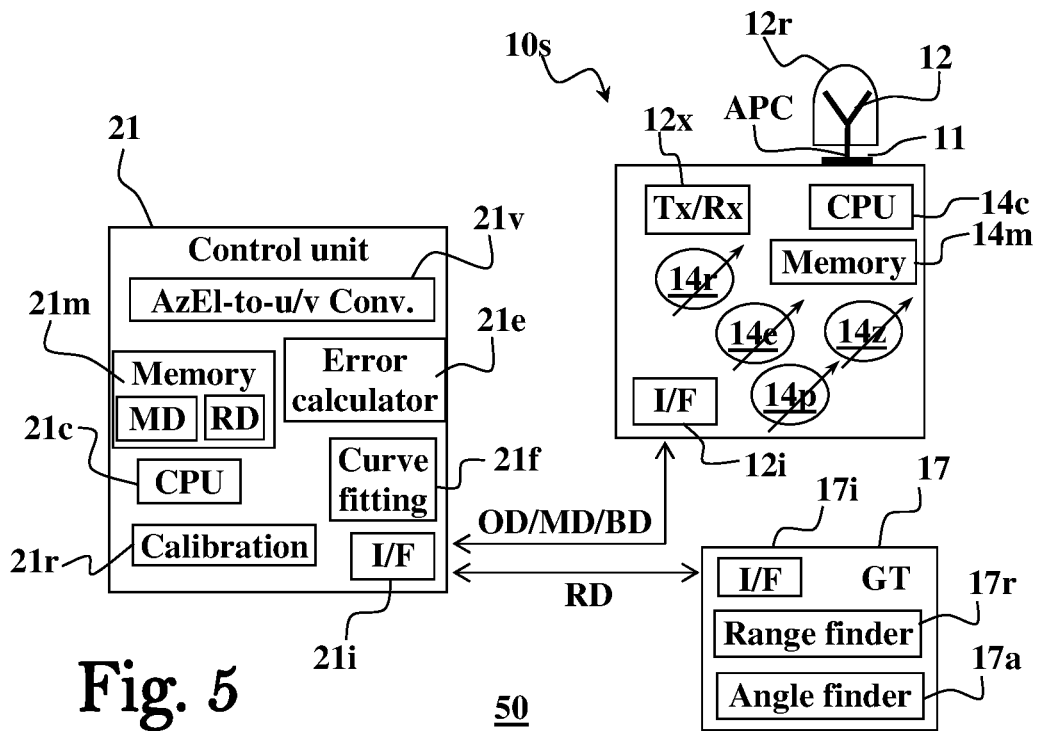
FIG. 5 is a block diagram schematically illustrating an antenna calibration system according to some possible embodiments.
Figure 6:
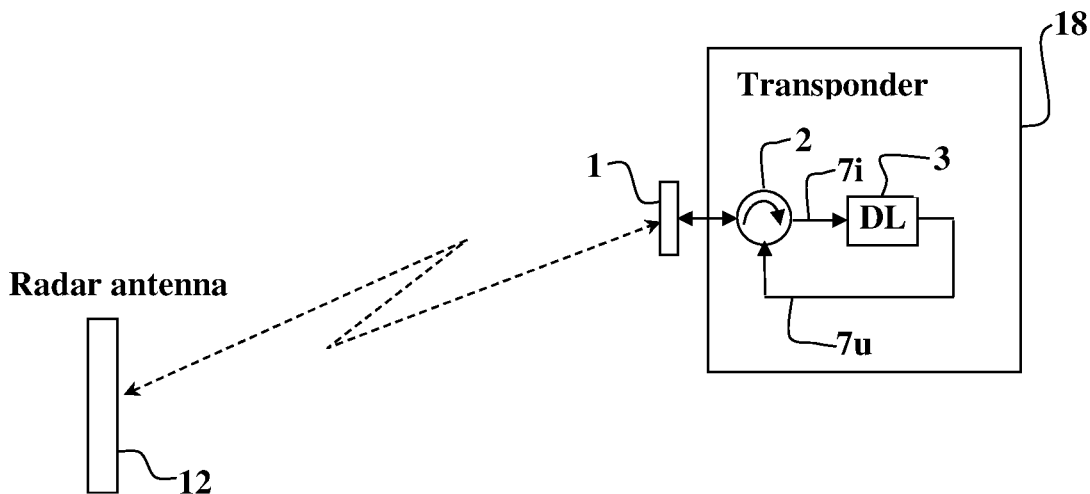
FIG. 6 is a block diagram schematically illustrating an RF target structure.

FIG. 5 is a block diagram schematically illustrating components of a system 50 for determining bias values/functions for a radar antenna system 10s, according to some possible embodiments. In system 50 the radar antenna system 10s and the surveying system 17 are configured to communicate data/signals with the control unit 21 via respective communication interface nodules (I/F) 12i, 17i and 21i. The I/F unit may be configured to communicate the signals/data over communication wires e.g., using serial (e.g., Ethernet, SPI, UART, USB, I2C, or suchlike) and/or parallel (e.g., ISA, ATA, SCSI, PCI, data bus, or suchlike) data communication schemes, and/or wirelessly e.g., RF data communication.

The surveying system 17 can comprise a range finder unit 17r for determining ranges/distances from the surveying system 17 to the RFT and the PARC, and an angle finder unit 17a for determining at least one angle of the RFT/PARC polar coordinates relative to the GT (e.g., elevation, azimuth). The data/signals measured by the range finder and angle finder units, 17r and 17a, also referred to herein as reference data (RD), is transmitted to the control unit 21 via the communication interface 17i. The control unit 21 can be configured to send data/instructions to the surveying system 17 via its communication interface 21i, such as, for example, instructions to measure range/angle values of a specific reference target element selected from a set of possible reference target elements in the far-filed of the radar antenna system 12, use certain measurement units, and/or move the surveying system 17 to a new location.

The antenna system 10s comprises a transceiver unit 12x for transmitting/receiving signals by the radar antenna 12, and one or more processing units 14c and memories 14m, configured to operate the antenna system 10s and process the data/signals used therein. Accordingly the processing unit 14c can be configured to read the angles measured by the azimuth angle sensor device 14z, by the elevation sensor device 14e, by the roll tilt sensor 14r, by the pitch tilt sensor 14p, which are also collectively referred to herein as orientation data (OD), and/or the electromagnetic echo signals receive by the radar antenna 12, also referred to herein as antenna measured data (MD), store this data in the memory 14m, and/or send it to the control unit 21 via the communication interface 12i. The processing unit 14c can be configured to receive biases values/functions, referred to herein as (BD), from the control unit 21 for correction of parameters measured by the radar antenna system 10s. The control unit 21 can be configured to transmit data/instructions to the antenna system 10s, such as, for example, instructions to set a new angular position of the rotatable support/antenna, requests to measure and transfer new OD and MD, use of certain measurement units, and suchlike.

The control unit 21 comprises one or more processing units 21c and memories 21m, configured and operable to at least receive the OD/MD and RD from the antenna system 10s and the surveying system 17 respectively, process the received data to determine bias values/functions for calibration of the radar antenna system 10s, and communicate the determined bias values/functions to the antenna system 10s via the I/F 21i. The control unit 21 can thus comprise a conversion module 21v configured and operable to convert coordinate data items determined using the antenna orientation measurement system 10s and/or the surveying system 17, from one coordinate system to another. In some embodiments the conversion module 21v is configured and operable to convert polar (Az/El) coordinates of the RFT into radar antenna sine space (u/v) coordinates. The control unit 21 can also include an error computation module 21e configured and operable to determine errors/deviations of the measured antenna coordinates of the RFT from the its reference coordinates, based on the OD and RD, and/or a curve fitting module 21f configured and operable to determine bias values/functions based on the OD, RD and the determined errors/deviations.

In some embodiments the bias values (or functions) are determined for defined ranges of the orientation angles measured by the antenna orientation measurement system. For example, a certain bias value (or function) can be determined for the measured antenna elevation angle ($El_{am}$) between 0° to 20°, another bias value (or function) for the range 20° to 40°, and so on, and also for the other measured orientation angles, and or broad side directions of the radar antenna. Of course different angle ranges can be used per specific implementation requirements e.g., 0°-10°, 10°-20°, 20°-30°, . . . . Using the techniques described above, the support platform, and/or antenna tilt angle, can be set into one or more angles within each range, and respective bias values (or functions) can be computed for each measured parameter, and/or broad side direction of the radar antenna. After the bias values and/or functions are determined, they can be stored in a memory of the system for later use.

Figure 7:
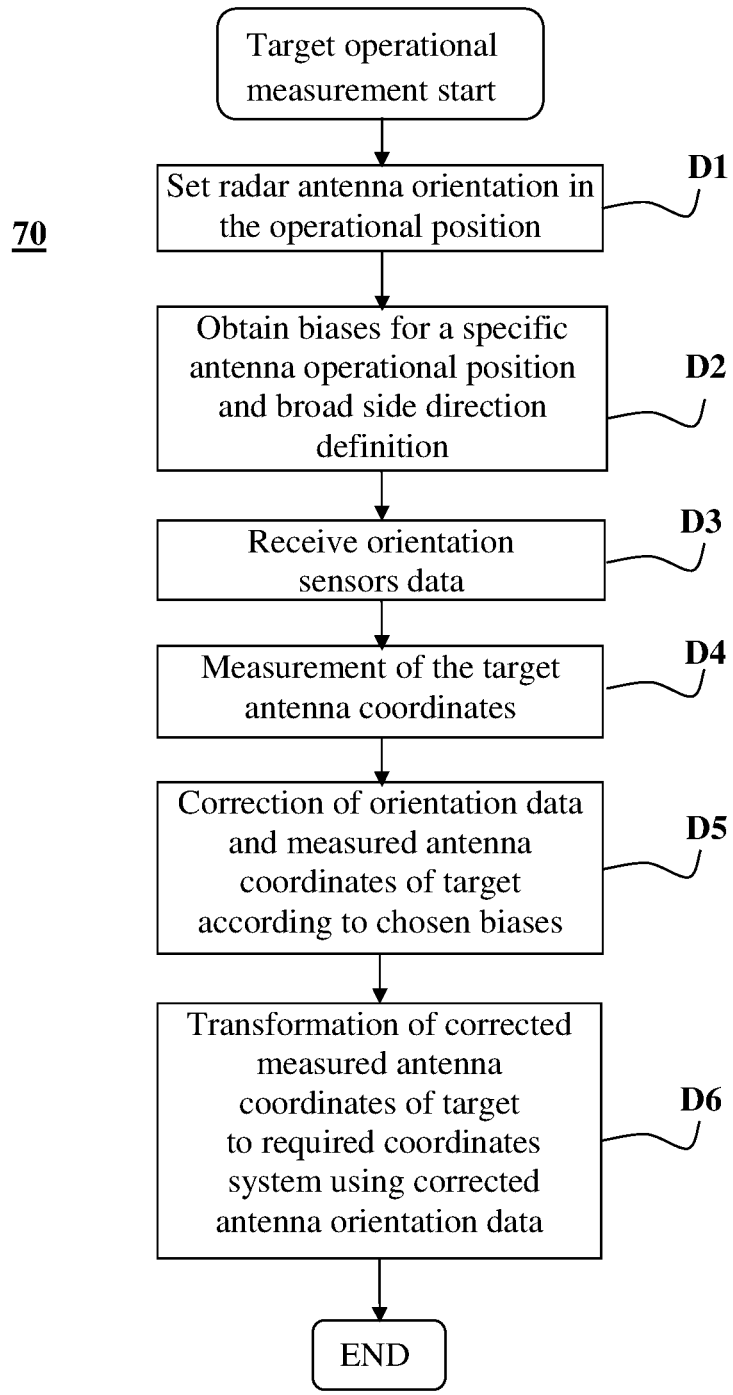
FIG. 7 is a flowchart schematically illustrating utilization of defined bias during the radar operational target measurement according to some possible embodiments.

FIG. 7 is a flowchart of a process 70 of determining radar targets coordinates in an operational state of the system, based on the bias values/functions determined for various different ranges of the measured orientation parameters. In the block D1 the radar antenna is set into a required angular position by setting the rotatable support (11) and the radar antenna (12) orientation for the target operational radar measurement. In the block D2 biases values/functions for the given antenna's orientation and beam's broad side direction are fetched from the memory of the system. In blocks D3 and D4 the antenna orientation data is generated, based on the received signals/data from the orientation sensors of the antenna orientation measurement system, and the antenna measurement data/coordinates of the target is generated, based on the received electromagnetic echo signal from the target.

In block D5 a respective bias value/function is fetched from the memory for each measured parameter according to the range to which the measured parameter belongs, and the fetched bias values/functions are then used to correct the measured orientation data and the measured antenna coordinates of the target according to equations (4) and (5). Transformation of the corrected measured antenna coordinates of the target into a different coordinates system of choice using the corrected antenna orientation data is then performed in block D6.

It is noted that throughout this disclosure, where a process or method is shown or described, the steps of the method may be performed in any order or simultaneously, unless it is clear from the context that one step depends on another being performed first. It is further noted that the processes/methods described in this disclosure can be realized as computer executable code created using a structured programming language (e.g., C), an object oriented programming language such as C++, or any other high-level or low-level programming language (including assembly languages, hardware description languages, and database programming languages and technologies) that may be stored, compiled or interpreted to run on one of the units/systems, as well as heterogeneous combinations of processors, processor architectures, or combinations of different hardware and software. The processing may be distributed across a number of computerized devices, which may be functionally integrated into a dedicated standalone system. All such permutations and combinations are intended to fall within the scope of the present disclosure.

Functions of the system(s) described hereinabove may be controlled through instructions executed by a computer-based control system which may be installed in one or more of the systems/units. A control system suitable for use with embodiments described hereinabove may include, for example, one or more processors connected to a communication bus, one or more volatile memories (e.g., random access memory—RAM) or non-volatile memories (e.g., Flash memory). A secondary memory (e.g., a hard disk drive, a removable storage drive, and/or removable memory chip such as an EPROM, PROM or Flash memory) may be used for storing data, computer programs or other instructions, to be loaded into the computer system.

For example, computer programs (e.g., computer control logic) may be loaded from the secondary memory into a main memory for execution by one or more processors of the system. Alternatively or additionally, Computer programs may be received via a communication interface. Such computer programs, when executed, enable the system to perform certain features of the present invention as discussed herein. In particular, the computer programs, when executed, enable a control processor to perform and/or cause the performance of features of the present invention. Accordingly, such computer programs may implement controllers of the computer system. In an embodiment where the invention is implemented using software, the software can be stored in a computer program product and loaded into the computer system using the removable storage drive, the memory chips or the communications interface. The control logic (software), when executed by a control processor, causes the control processor to perform certain functions of the invention as described herein.

In another embodiment, features of the invention are implemented primarily in hardware using, for example, hardware components such as application specific integrated circuits (ASICs) or field-programmable gated arrays (FPGAs). Implementation of the hardware state machine so as to perform the functions described herein will be apparent to persons skilled in the relevant art(s). In yet another embodiment, features of the invention can be implemented using a combination of both hardware and software.

As described hereinabove and shown in the associated figures, the present application provides antenna calibration setups and related methods. While particular embodiments have been described, it will be understood, however, that the application is not limited thereto, since modifications may be made by those skilled in the art, particularly in light of the foregoing teachings. As will be appreciated by the skilled person, the invention can be carried out in a great variety of ways, employing more than one technique from those described above, all without exceeding the scope of the claims.

The invention claimed is:

1. A method of calibrating a radar antenna mounted on a rotatable support, said radar antenna being mounted at a predetermined position relative to a reference point on said rotatable support, the method comprising:
receiving reference data indicative of a position of a target element relative to a reference location, and of a position of said reference point on said rotatable support relative to said reference location;
receiving orientation data indicative of at least one angular position of said rotatable support and antenna measurement data indicative of electromagnetic echo signals received by said radar antenna from said reference target element;
determining a measured position of said target element relative to said radar antenna, based on at least a portion of said antenna measurement data;
determining a reference position of said target element relative to said radar antenna, based on said reference data and on at least a portion of said orientation data; and
determining at least one bias value or function associated with at least one of said orientation data or said antenna measurement data, based on a deviation between the determined measured position and reference position of said target element.

2. The method of claim 1, further comprising:
rotating the rotatable support into two or more different angular positions;
determining two or more respective orientation data instances for each of said different angular positions of said rotatable support, corresponding two or more measured position instances of the target element based on respective electromagnetic echo signals received by the radar antenna at said two or more angular positions, and corresponding reference position instances of the target element based on said respective two or more orientation data instances and the reference data; and
determining at least one bias value or function for each of said two or more different angular positions of the rotatable support based on a deviation between the measured position and the determined reference position of the target element determined for each of said two or more different angular positions of the rotatable support.

3. The method of claim 2, further comprising applying a curve fitting process based on the deviation between the respective determined measured and reference positions instances of the target element, and deriving the at least one bias value or function therefrom.

4. The method of claim 3 wherein the curve fitting process comprises a least mean squares error minimization process.

5. The method of claim 1, wherein the at least one angular position of the rotatable support comprises at least one of the following: a measured azimuth angle of the rotatable support, a measured roll tilt angle of the rotatable support, or a measured pitch tilt angle of the rotatable support.

6. The method of claim 1, wherein at least one of the following:
determining the reference position of the target element comprises processing data indicative of the at least one angular position of the rotatable support; and
the reference position and the measured position of the target element are determined relative to a center of the radar antenna, and wherein determining the reference position of the target element comprises determining a position of the center of the radar antenna relative to the reference point of the rotatable support; or
the radar antenna is a phased array antenna, and the reference position and the measured position of the target element are determined relative to a phase center of said phased array antenna, and wherein determining the reference position of the target element comprises determining a position of said phase center of the radar antenna relative to the reference point of the rotatable support; and
the reference point is a center of the rotatable support.

7. The method of claim 1, wherein the determining of the measured position of the target element comprises processing data indicative of the electromagnetic echo signal received from target element.

8. The method of claim 1 wherein the orientation data comprises a measured elevation angle of the radar antenna, and wherein determining the reference position of the target element comprises determining a position of the center of the radar antenna relative to the reference point of the rotatable support based on said measured elevation angle.

9. The method claim 1 comprising generating the reference data by a surveying system configured to measure polar coordinates of said target element, and of said reference point, relative to said reference location.

10. The method of claim 1, wherein the at least one bias value comprises at least one of the following: bias of a measured azimuth angle of the rotatable support, bias of a measured elevation angle of the antenna, bias of a measured roll tilt angle of the rotatable support, or bias of a measured pitch tilt angle of the rotatable support.

11. A system for calibrating a radar system comprising a radar antenna mounted on a rotatable support at a predetermined position relative to a reference point on said rotatable support, the system comprising:
orientation measurement system configured to measure at least one orientation angle of said rotatable support and generate orientation data indicative of at least one angular position of said rotatable support;
a surveying device configured to measure position of a target element, and a position of said reference point on said rotatable support, and generate reference data indicative thereof; and
a control unit comprising one or more processors and memories configured and operable to receive antenna measurement data indicative of electromagnetic echo signals received by said radar antenna from said reference target element, determine a measured position of said target element relative to said antenna based on at least a portion of said antenna measurement data, determine a reference position of said target element relative to said radar antenna based on said reference data and on at least a portion of said orientation data, and determine at least one bias value or bias function associated with at least one of said orientation data or said antenna measurement data, based on a deviation between the determined measured position and reference position of said target element.

12. The system of claim 11 wherein the control unit is configured and operable to generate instructions for rotating the rotatable support into two or more different angular positions, receive from said orientation measurement system two or more respective orientation data instances for each of said different angular positions of said rotatable support, determine corresponding two or more respective measured position instances of the target element based on respective electromagnetic echo signals received by the radar antenna at the two or more different angular positions, determine corresponding reference position instances of the target element based on said respective two or more orientation data instances and the reference data; and determine at least one bias value or function for each of said two or more different angular positions of the rotatable support based on a deviation between the respective determined measured position of the target element and reference position of the target element at each of said two or more different angular positions.

13. The system of claim 12 wherein the control unit is configured and operable to apply a curve fitting process based on the deviation between the respective determined measured and reference positions instances of the target element, and deriving the at least one bias value or function therefrom.

14. The system of claim 11, wherein the at least one angular position of the rotatable support measured by the orientation measurement system comprises at least one of the following: a measured azimuth angle of the rotatable support, a measured roll tilt angle of the rotatable support, or a measured pitch tilt angle of the rotatable support.

15. The system of claim 11, wherein at least one of the following:
the control unit is configured and operable to determine the reference position and the measured position of the target element relative to a center of the radar antenna;
the control unit is configured and operable to determine the reference position of the target element based on a position of the center of the radar antenna relative to the reference point of the rotatable support; or
the radar antenna is a phased array antenna, and wherein the control unit is configured and operable to determine the reference and measured positions of the target element relative to a phase center of said phased array antenna.

16. The system of claim 11, wherein the reference point is a center of the rotatable support, and wherein the control unit is configured and operable to determine the reference position of the target element based on a position of the center of the radar antenna relative to the reference point of the rotatable support.

17. The system of claim 16 wherein the orientation data comprises a measured elevation angle of the radar antenna, and wherein the control unit is configured and operable to determine the position of the center of the radar antenna relative to the reference point of the rotatable support based on said measured elevation angle.

18. The system of claim 11, wherein the surveying device comprises at least one of the following:
a range finder capable of measuring a distance between said surveying device and the target element, and an angle finder capable of measuring angular position of the target element with respect to said surveying device; or
a gyro theodolite.

19. The system of claim 11, wherein the target element comprises at least one antennas element coupled to a transponder configured to cause a time delay in the receipt of the electromagnetic signals from said target element.

20. The system of claim 11, wherein the control unit is configured and operable to determine a bias value or function for at least one of the following: a measured azimuth angle of the rotatable support, a measured elevation angle of the antenna, a measured roll tilt angle of the rotatable support, or a measured pitch tilt angle of the rotatable support.

* * * * *